US012658687B2

(12) United States Patent
Liu et al.

(10) Patent No.: US 12,658,687 B2
(45) Date of Patent: Jun. 16, 2026

(54) METHOD AND SYSTEM FOR SHORT-CIRCUIT PROTECTION OF EMERGENCY STARTING POWER SUPPLY

(71) Applicant: SHENZHEN GREPOW BATTERY CO., LTD, Shenzhen (CN)

(72) Inventors: Bing Liu, Shenzhen (CN); Xiangbo Li, Guangdong (CN); Gongjiao Tao, Shenzhen (CN); Binghua Hu, Shenzhen (CN)

(73) Assignee: SHENZHEN GREPOW BATTERY CO., LTD, Shenzhen (CN)

( * ) Notice: Subject to any disclaimer, the term of this patent is extended or adjusted under 35 U.S.C. 154(b) by 226 days.

(21) Appl. No.: 18/266,292

(22) PCT Filed: Mar. 16, 2021

(86) PCT No.: PCT/CN2021/081133
§ 371 (c)(1),
(2) Date: Jun. 9, 2023

(87) PCT Pub. No.: WO2022/126880
PCT Pub. Date: Jun. 23, 2022

(65) Prior Publication Data
US 2024/0030702 A1    Jan. 25, 2024

(30) Foreign Application Priority Data

Dec. 17, 2020    (CN) ........................ 202011497827.X

(51) Int. Cl.
H02H 3/44    (2006.01)
G01R 31/52    (2020.01)
(Continued)

(52) U.S. Cl.
CPC .............. H02H 3/44 (2013.01); G01R 31/52 (2020.01); H02H 3/38 (2013.01); H02H 7/18 (2013.01)

(58) Field of Classification Search
CPC ... H02H 3/44; H02H 3/38; H02H 7/18; G01R 31/52
See application file for complete search history.

(56) References Cited

U.S. PATENT DOCUMENTS 10,132,868 B2 * 11/2018 Sun ...................... H01M 50/581
11,156,669 B2 * 10/2021 Chang ................ G01R 31/3828
(Continued)

*Primary Examiner* — Crystal L Hammond
*Assistant Examiner* — Samantha L Faubert
(74) *Attorney, Agent, or Firm* — Birchwood IP

(57) ABSTRACT

Disclosed are a method and system for short-circuit protection of emergency starting power supply. An electrical parameter of an emergency starting power supply is detected multiple times at a relatively high frequency, so as to identify whether there is an exception according to the change difference and change direction of the electrical parameter, whether the emergency starting power supply is short-circuited according to the counting determination results, and then exception protection is implemented, so that a normal start state and a short-circuit state are effectively distinguished, thereby avoiding damage caused by a short circuit. The present disclosure has good adaptability and can be adapted to various start power supplies and automobile start loads, and it can be combined with an existing starting power supply circuit structure, an additional sensing device is not required, thereby improving the use safety and experience of the emergency starting power supply.

6 Claims, 3 Drawing Sheets

(51) Int. Cl.
    H02H 3/38           (2006.01)
    H02H 7/18           (2006.01)

(56)              References Cited

U.S. PATENT DOCUMENTS

| | | | |
|---|---|---|---|
| 2007/0153436 A1* | 7/2007 | Pellon | H02H 1/0015 |
| | | | 361/42 |
| 2019/0011492 A1* | 1/2019 | Handy | G01R 31/008 |
| 2020/0295592 A1* | 9/2020 | Lei | H02J 7/0031 |

* cited by examiner

METHOD AND SYSTEM FOR SHORT-CIRCUIT PROTECTION OF EMERGENCY STARTING POWER SUPPLY

BACKGROUND OF THE INVENTION

The present disclosure relates to the field of short-circuit test determination and emergency starting power supply protection, in particular to a method and system for short-circuit protection of emergency starting power supply.

As a multi-functional portable mobile power supply, an emergency starting power supply of an automobile can be used to start the automobile when the automobile is out of power or cannot be started for other reasons. The emergency starting power supply mainly includes a storage battery, a power supply control circuit and connecting wires (connection clamps). During use, start systems of a majority of vehicle or a small amount of boats are connected to the emergency starting power supply to supply power for the systems or the storage batteries therein. However, there are many types of cars, and requirements for the starting power supply are particularly high. Therefore, the output current of the emergency starting power supply can reach hundreds of amperes, but its output voltage is generally only ten voltages for safety purposes. The output current of the emergency starting power supply is very close to the short-circuit current in value, so it is difficult to identify the occurrence of short circuit by directly measuring the voltage, current and other parameters in the emergency starting power supply. If the short circuit situation cannot be distinguished in a quick and accurate manner, internal components of the power supply will be damaged, and even spontaneous combustion of the battery will occur, thereby causing harm. Similarly, if normal starting is misjudged as a short circuit situation, the emergency starting power supply will not play its due function.

In order to identify the short circuit and realize the short circuit protection, most solutions in the prior art are to wait for automatic shutdown of the emergency starting power supply after exceeding the preset time during the one-time starting process. Such type of solutions involves a relatively long waiting time. If a short circuit occurs, internal components of the power supply will be damaged during the starting process, and the power supply cannot be protected in time. Moreover, a wide variety of vehicles have different starting characteristics, and the fixed waiting time may damage the power supply in some starting short-circuit cases. Other solutions are to detect the temperature of the short-circuit heating parts such as storage batteries in the emergency starting power supply, and turn off the power supply when the temperature exceeds the preset value. Such type of solutions can give reaction of shutdown only after the short circuit happens and has already caused the impact, and they are easy to lead to misjudgment due to environmental factors. Further, the service life of the storage battery in the power supply is likely to be shortened when the battery runs at a high temperature.

BRIEF SUMMARY OF THE INVENTION

In order to overcome the problems existing in the prior art, the present disclosure provides a method and system for short-circuit protection of emergency starting power supply, which can accurately and quickly distinguish whether an emergency starting power supply of an automobile is short-circuited or in an abnormal short circuit state, and carry out the corresponding protection operation. Moreover, the short circuit determination process is not affected by the environment, therefore, the system and method are suitable for all kinds of vehicle starting systems, thereby realizing safe and reliable protection of the emergency starting power supply of the vehicle.

In order to achieve the above object, the present disclosure uses the following technical solution:

An emergency start power supply short-circuit protection method applied to an emergency start power supply, the emergency start power supply at least comprises a storage battery, a control device and a connection port, wherein when the emergency start power supply is under the emergency starting operating conditions with load, the short-circuit detection of the emergency start power supply is switched on; the short-circuit detection comprises the following steps:

continuously measuring electrical parameters of the emergency start power supply at a preset frequency;

determining whether the operation of the emergency start power supply is abnormal according to the change difference and change direction of the electrical parameters measured at two consecutive times, and counting the abnormality determination; and when the count of continuous abnormality determination reaches a preset number of times, it can be determined that the emergency start power supply is short-circuited, and the control device is driven to cut off the communication between the storage battery and the connection port; when the count of continuous abnormality determination does not exceed the preset number of times, it can be determined that the emergency start power supply is in a normal state, the count will be cleared and recorded again.

wherein the electrical parameters for measuring the emergency start power supply are voltage parameters;

when a change in the voltage parameters measured at two consecutive times falls with a preset range, or the change in the voltage parameters measured at two consecutive times exceed the preset range and the voltage parameters are reducing, it can be determined that the emergency start power supply in such period runs abnormally;

when a change in the voltage parameters measured at two consecutive times exceeds the preset range, and the voltage parameters are rising, it can be determined that the emergency start power supply in such period runs normally; or wherein the electrical parameters for measuring the emergency start power supply are current parameters;

when a change in the current parameters measured at two consecutive times falls with the preset range, or the change in the current parameters measured at two consecutive times exceed the preset range and the current parameters are rising, it can be determined that the emergency start power supply in such period runs abnormally;

when a change in the current parameters measured at two consecutive times exceeds the preset range, and the current parameters are reducing, it can be determined that the emergency start power supply in such period runs normally.

wherein the short-circuit detection further comprises the following steps:

recording normal electrical parameters when a normality determination occurs. When the count of consecutive normality determination reaches the preset number of times (B), the difference between the current electrical parameters and the last recorded normal electrical parameters is identified. Under the condition that the difference falls within a first preset value, the short-circuit detection step will be performed again; under the condition that the difference exceeds the first preset value, it can be determined that the emergency start power supply is short-circuited and the circuit is disconnected.

wherein the step of determining the operating conditions for emergency starting of the emergency start power supply: continuously detecting whether the electrical parameters of the connection port meet the starting requirements, or detecting whether the starting switch of the emergency start power supply is in an open state, so as to determine whether the emergency start power supply is under the operating conditions for emergency starting; and the steps of determining whether there is a load; detecting and recording first electrical parameters that meets the operating conditions of the emergency start power supply, and continuing to detect the electrical parameters until the difference between the real-time electrical parameters and the first electrical parameters exceeds a second preset value, it can be determined that there is a load and the short-circuit measurement is then performed, otherwise it can be determined that there is not any load, and continuously detecting whether there is any load until a preset time period is exceeded.

wherein the preset frequency should be that the interval between two consecutive measurements does not exceed 30 ms, and the preset number of times falls within 25-35; the short-circuit detection further comprises the following steps: when the short-circuit detection exceeds the preset time period, the control device is driven to cut off the communication between the storage battery and the connection port.

wherein the short-circuit protection system is disposed in the circuit between the storage battery and the connection port in the emergency start power supply, and the short-circuit protection system comprises a short circuit detection module 4; and the short-circuit protection system comprises:

a data acquisition unit used for continuously measuring electrical parameters of the emergency start power supply at the preset frequency (A);

a data comparison unit used for determining whether the operation of the emergency start power supply is abnormal according to the change difference and change direction of the electrical parameters measured at two consecutive times;

a counting unit used for counting the abnormality determination; and a short circuit determination unit, when the count of continuous abnormality determination reaches a preset number of times, it can be determined that the emergency start power supply is short-circuited, and the control device is driven to cut off the communication between the storage battery and the connection port; when the count of continuous abnormality determination does not exceed the preset number of times, it can be determined that the emergency start power supply is in a normal state, and count of the counting unit will be driven to be cleared and recorded again.

wherein the data acquisition unit used for acquiring the voltage parameters, the data comparison unit used for identifying whether a change in the voltage parameters measured at two consecutive times falls with a preset range, and the data comparison unit used for identifying whether the change direction of the voltage parameters is rising or reducing; when a change in the voltage parameters measured at two consecutive times falls with a preset range, or the change in the voltage parameters measured at two consecutive times exceed the preset range and the voltage parameters are reducing, it can be determined an abnormality occurs, in which case, the counting unit counts the abnormality determination; or the data acquisition unit used for acquiring the current parameters, the data comparison unit used for identifying whether a change in the current parameters measured at two consecutive times falls with a preset range, and the data comparison unit used for identifying whether the change direction of the current parameters is rising or reducing; when a change in the current parameters measured at two consecutive times falls with a preset range, or the change in the current parameters measured at two consecutive times exceed the preset range and the current parameters are rising, it can be determined an abnormality occurs, in which case, the counting unit counts the abnormality determination.

wherein the short circuit detection module further comprises a state-of-charging exclusion unit used for recording normal electrical parameters when a normality determination occurs. When the count of consecutive normality determination reaches the preset number of times, the difference between the current electrical parameters and the last recorded normal electrical parameters is identified. Under the condition that the difference falls within a first preset value, the short-circuit detection step will be performed again; under the condition that the difference exceeds the first preset value, it can be determined that the emergency start power supply is short-circuited and the circuit is disconnected.

wherein the system further comprises an emergency starting operation determination module used for continuously detecting whether the electrical parameters of the connection port meet the starting requirements, or detecting whether the starting switch of the emergency start power supply is in an open state, so as to determine whether the emergency start power supply is under the operating conditions of the emergency start power supply; and the system further comprises a load determination module used for detecting and recording first electrical parameters that meets the operating conditions of the emergency start power supply, and continuing to detect the electrical parameters until the difference between the real-time electrical parameters and the first electrical parameters exceeds a second preset value, it can be determined that there is a load and the short-circuit measurement is then performed, otherwise it can be determined that there is not any load, and continuously detecting whether there is any load until a preset time period is exceeded.

wherein short circuit detection module further comprises a timeout switch-off unit, the timeout switch-off unit is used for driving the control device to cut off the communication between the storage battery and the connection port when the short circuit exceeds the preset time period.

Compared with the prior art, the present disclosure has the beneficial effects as follows:

(1) in the present disclosure, electrical parameters of an emergency starting power supply are detected multiple times at a relatively high frequency and whether there is an exception is determined according to the change difference and change direction of the electrical parameter, whether the emergency starting power supply is short-circuited is determined by counting determination results, and then exception protection is implemented, so that a normal start state and a short-circuit state is effectively distinguished, and the accuracy of detection is ensured; meanwhile, the determination results can be obtained in less than 1 second, the system features fast detection, thereby greatly shortening the duration of damaging effects caused by the short circuit; the system and method of the present disclosure can be adapted to various vehicle starting loads and has good adaptability; the system and method of the present disclosure require few detection resources and no additional sensing devices, and can be combined into the existing starting power circuit structure, thereby improving the safety and experience of the emergency starting power supply in a comprehensive manner;

(2) by taking small fluctuations of the electrical parameters and the voltage drop/current rising as the bases for abnormality determination, and the over-amplitude fluctuations of the electrical parameters and the voltage rising/current reducing of the electrical parameters as the bases for normality determination, the present disclosure realizes accurate detection of a short circuit in combination with the characteristics of normal starting and short circuit;

(3) after reaching a preset number of consecutive abnormalities, the present disclosure uses the initial values of the voltage rising/current reducing as a reference, and determines that the power system is in a charging state when the real-time voltage is lower than the reference/the current is higher than the reference, so as to exclude normal situations with small fluctuations in the charging state, so that the accuracy of normality detection is further improved;

(4) the present disclosure further employs the starting condition detection and load detection as a pre-test of short circuit, and the short circuit detection only needs to be performed when there is a possibility of short circuit, so as to avoid other characteristics of the circuit from affecting the accuracy of detection; and (5) the present disclosure further makes the system more secure, stable and automatic by setting the timeout switch-off.

The present disclosure will be further described below with reference to the accompanying drawings.

In the accompanying drawings: 11. storage battery; 12. control device; 13. connection port; 2. emergency starting operation determination module; 3. load determination module; 4. short circuit detection module; 41. data acquisition unit; 42. data comparison unit; 43. counting unit; 44. short-circuit determination unit; 45. state-of-charging exclusion unit; 46. timeout switch-off unit; and 5. starting load.

DETAILED DESCRIPTION OF THE INVENTION

In order to better illustrate the objects, technical solutions and advantages of the present disclosure, specific implementation of the present disclosure will be further described below in detail in conjunction with the accompanying drawings and embodiments. The following embodiments are used for describing the present disclosure, but are not used for limiting the scope of the present disclosure.

Figure 1:
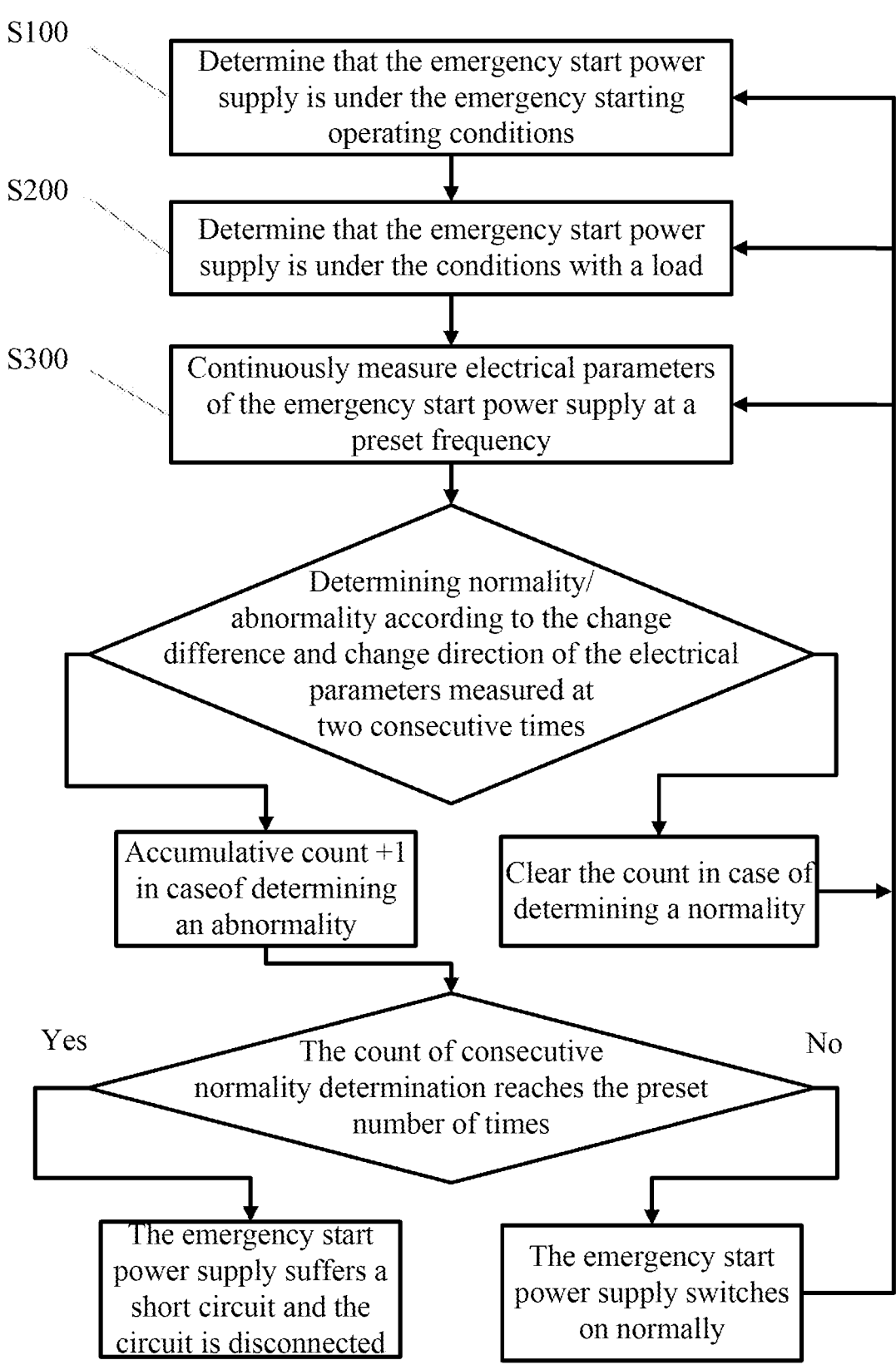
FIG. 1 is a schematic diagram of steps of a method for short-circuit protection of emergency starting power supply.
Figure 2:
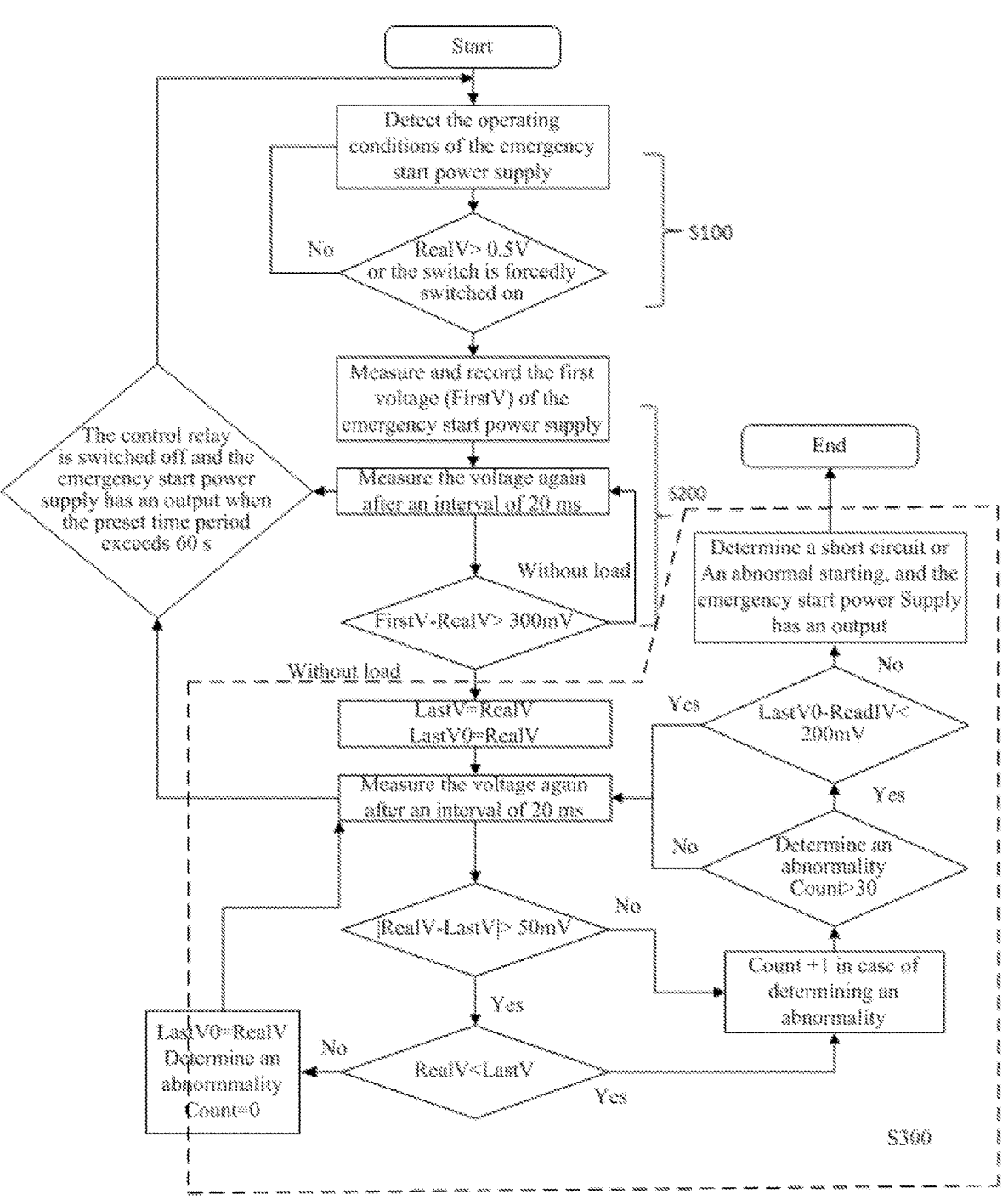
FIG. 2 is a schematic flow diagram of a method for short-circuit protection of emergency starting power supply.

As shown in FIGS. 1 and 2, in order to accurately and quickly distinguish whether an emergency starting power supply of an automobile is short-circuited, an embodiment of the present disclosure provides a method for short-circuit protection of emergency starting power supply, which is applied as an emergency starting power supply. The emergency starting power supply is provided with a storage battery 11, a relay and a connection clamp connected in sequence. The relay serves as a control device 12, and the connection clap serves as a connection port 13. In use, the connection clamp is connected to the backup battery or the start system for power supply. The short-circuit protection method includes the following steps:

S100 is a step of detecting starting conditions. When the voltage parameter of the connection clamp is greater than 0.5 V, or the starting switch of the starting power supply is in an "on" state, it can be determined that the starting conditions are satisfied, and the step S200 is then performed to detect whether there is a load. When the conditions are not satisfied, it will continue to monitor whether the starting conditions are established.

It can be understood that the step S100 is performed to detect whether the emergency starting power supply is in a dormant state or in an emergency starting state. Apparently, the basis for whether to perform a short-circuit detection is available only in the emergency starting state. In some cases, when the voltage of the connection clamp is greater than 0.5 V, it can be determined that the relay is turned on and the battery 11 is supplying power; in other cases, it can be determined by identifying the state of the starting switch.

S200 is a step of detecting whether there is a load. After the starting conditions are satisfied, a first voltage (FirstV) of the emergency starting power supply is detected, a real-time voltage (RealV) is detected again after an interval of 20 ms, and comparison is performed to identify whether the difference between the FirstV and the RealV exceeds 300 mV, a second preset value E. Under the condition that "FirstV−RealV>300 mV", it will be determined that there is a load, and the step of short circuit measurement S300 will be then performed. Under the condition that "FirstV−RealV≤300 mV", it will continue to detect whether the conditions are satisfied, until a preset time period F exceeds 60 s, the control relay is switched off and the emergency starting power supply has an output.

It should be noted that, in the step S200, it is necessary to detect whether the connection clamp of the emergency starting power supply is connected properly, otherwise, the power supply will be abnormal after the emergency starting power supply is started when the connection clamp is of poor connection. The conventional output voltage of the emergency starting power supply falls between 12 V and 16 V. For various vehicle starting systems, when the starting conditions are triggered, the connection clamp approximates to an open circuit, and its voltage parameter measured for the first time (FirstV) almost equals to the voltage of the open circuit; at the moment when a load is connected to the emergency starting power supply to form a current loop, a large voltage drop will generate and make the RealV lower than the FirstV. When the connection clamp is not connected to the load, the circuit may be an open circuit or may be subjected to a large resistance due to poor contact, the RealV will be close to FirstV. By comparing the electrical parameters measured at different moments, the present disclosure can obtain measurement results that are not affected by the environmental and equipment foundation, therefore, these measurement results have the advantage of accuracy.

S300 is a step of detecting a short circuit. After the load conditions are satisfied, the RealV when the load is satisfied is preset as the recovered normal voltage parameter LastV0, the real-time voltage RealV is continuously detected at intervals of 20 ms at a preset frequency A, and the last detected voltage is recorded as LastV. For each detection, comparison will be made to identify whether the difference between the RealV and the LastV is higher than 50 mV, a preset range C, and it will be determined that: under the condition that "|RealV−LastV|≤50 mV", one count will be increased for a count of abnormality determination; under the condition that "|RealV−LastV|>50 mV, and RealV<LastV", one count will be increased for a count of abnormality determination; and under the condition that "|RealV−LastV|>50 mV, and RealV≥LastV", the accumulative count of abnormality determination will be cleared, and at the same time, the LastV0 is recorded as the RealV of this measurement. When the preset times B of accumulative abnormality determination is 30 times, and the Count>30, comparison will be made to identify the difference between the RealV and the recovered LastV0 exceeds the first preset value D. In this embodiment, the first preset value D is 200 mV. Under the condition that "RealV<LastV0−200 mV", it can be determined that the emergency power supply is short-circuited or abnormally started, and the output of the storage battery 11 is turned off through the relay; under the condition that "RealV≥LastV0−200 mV", it can be determined that the emergency power supply is in a charging mode, and the step S300 will be performed again to detect a short circuit, until the control relay turns off and the emergency starting power outputs after the timeout of 60 s.

It should be noted that, in the step S300, although electrical parameter characteristics of normal starting state and short circuit state are similar, the electrical parameters in the short circuit state have the characteristics of continuous small fluctuations, therefore, it is necessary to compare the variation range of |RealV−LastV|. Comparing and calculating that an absolute value of the difference between RealV and LastV falls within the preset range C, it can be identified hat there is a possibility of being in a short circuit state, and the times of accumulative abnormalities in the detection will be counted. In a normal starting state, the vehicle will take power from the power supply, the starting system will show characteristics of fluctuations, that is, the voltage will drop when starting, and the voltage will rise when the starting is interrupted. Therefore, on the one hand, when |RealV−LastV| exceeds the preset range C, but "RealV>LastV" at that moment, it can be considered that the current RealV is the recovered voltage, in which case, the emergency starting power supply has normal starting conditions, and the count of abnormality determination will be cleared, that is, the count of abnormality determination count before the normal starting conditions are satisfied can be considered normal. On the other hand, although |RealV−LastV| exceeds the preset range C, but RealV<LastV at that moment, the power supply is in a starting state or an initial short circuit happens, and all voltage parameters drop rapidly, in which case, it can be considered that the RealV is a falling voltage, an abnormality is thus identified, and the count of accumulative abnormality is accordingly increased.

It should be noted that, in the step S300, a short circuit may be identified under the condition that the normal voltage parameter LastV0 occurs when a recovered voltage is continuously recorded, and the count of abnormality determination reaches 30, and the RealV and the LastV0 are compared again, so as to exclude the situation that emergency starting power supply charges the backup power supply. In such charging state, the voltage features less fluctuations and longer duration. The emergency starting power supply is allowed to charge the backup power supply of the vehicle, but compared with the recovered voltage in the starting process, the voltage parameters during charging are different from those of the LastV0. When LastV0−RealV<200 mV, it can be determined that the fluctuations of the voltage parameters are limited only because the power supply is in a charging state, rather than a short circuit.

It could be understood that the above preset parameters may vary according to the emergency starting voltage and the characteristics of the vehicle starting system to which it is applied. In general, the preset frequency A should be that the interval between two consecutive measurements does not exceed 30 ms, and the preset number of times B falls within 25-35. Values of the preset range C of the voltage parameters should be between 40 and 60 mV. The difference between the previous electric parameter and the last-recorded normal electric parameter is identified as a first preset value D, with the value falling between 180-220 mV. The value of a preset duration F falls between 50 s-70 s. A voltage at the connection port 13 is detected to identify whether the starting requirements are satisfied, and the value thereof is less than 2V. The difference between the real-time voltage and the first voltage is identified as a second preset value E, with the value being more than 280 mV.

It could be understood that, in addition to the voltage parameter, the current parameter or other electric parameters can also be used to determine whether the emergency starting power supply is short-circuited. When the electrical parameters are used to determine whether the emergency starting power supply is short-circuited, and when changes in current parameters measured at two consecutive times exceed a preset range C and the current parameters are rising, it can be determined that the emergency starting power supply runs abnormally. When changes in the current parameters measured at two consecutive times exceed the preset range C and the current parameters are reducing, it can be determined that the emergency starting power supply runs normally.

Figure 3:
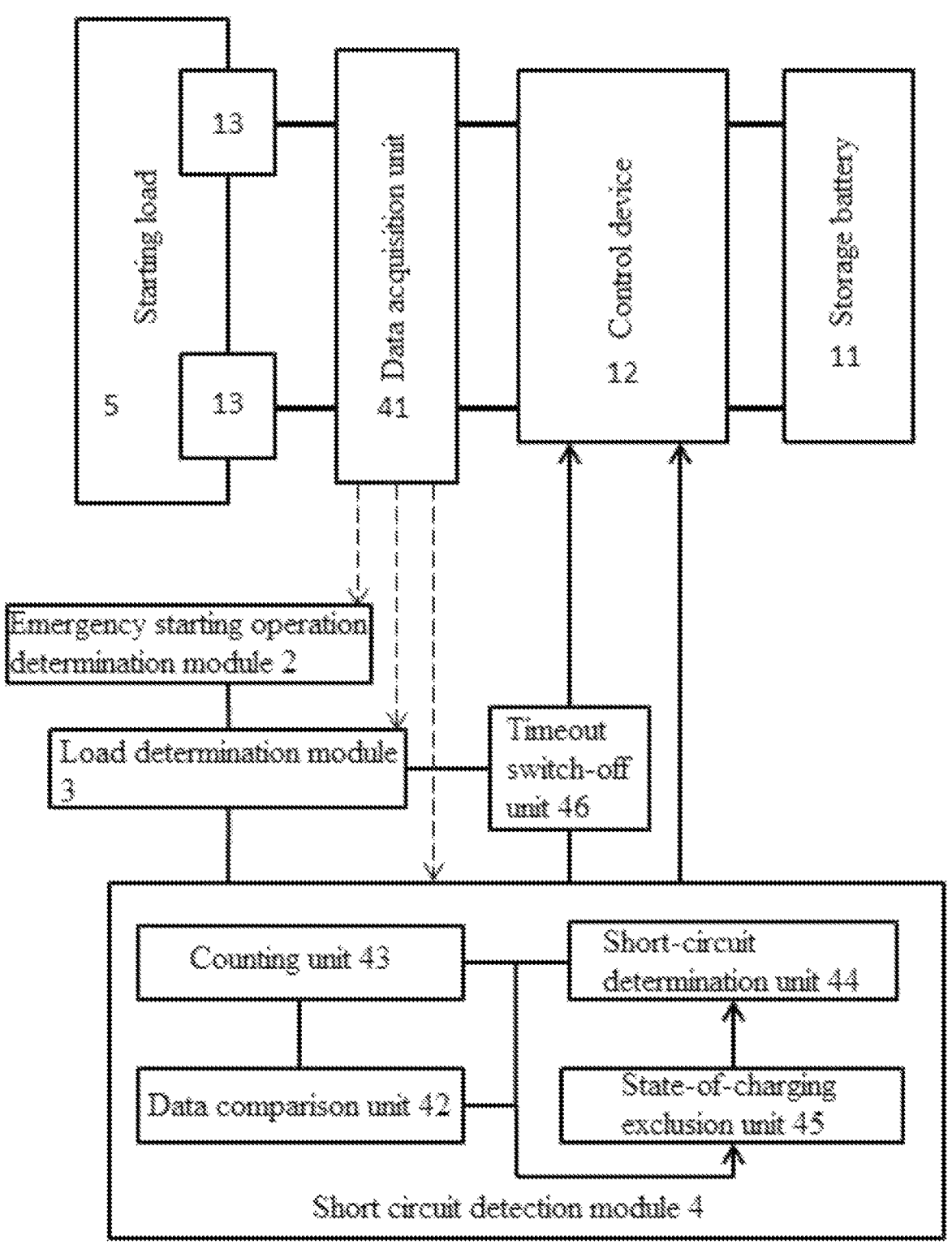
FIG. 3 is a structural schematic diagram of a system for short-circuit protection of emergency starting power supply.

As shown in FIGS. 1 and 3, according to the emergency starting power supply short-circuit protection method provided in the present disclosure, this embodiment, on the other hand, accordingly contains a system for short-circuit protection of emergency starting power supply. The short-circuit protection system is disposed in the circuit between the storage battery 11 and the connection port 13 in the emergency starting power supply. The short-circuit protection system includes an emergency starting operation determination module 2, a load determination module 3 and a short circuit detection module 4, where the short circuit detection module 4 includes a data acquisition unit 41, a data comparison unit 42, a counting unit 43, a short circuit determination unit 44, a state-of-charging exclusion unit 45 and a timeout switch-off unit 46.

It should be noted that the data acquisition unit 41 includes a component that senses the electrical parameters of the emergency starting power supply, and a data processing device that acquires and processes the electrical parameters of the data acquisition unit. The emergency starting operation determination module 2, the load determination module 3 and the short circuit detection module 4 include components for calculating, determining and recording, as well as programs set in these components used for realizing the determination of the emergency starting operation, the existence of load and the detection of short circuit. The emergency starting operation determination module 2 can use parameters of the data acquisition unit 41 to determine whether the conditions for starting operation are satisfied, and the emergency starting operation determination module 2 is connected to the load determination module 3 to transmit the processing results. The load determination module 3 can use parameters of the data acquisition unit 41, and can record the acquired parameters (such as, recording FirstV), so as to obtain a result whether there is any load. The load determination module 3 is connected to the short circuit detection module 4 to transmit the processing results. In the short circuit detection module 4, the data comparison unit 42 compares the variation difference and variation direction of the electrical parameters before and after the comparison through regular calculation and record. The counting unit 43 performs counting according to the variation difference and variation direction. A count will be made for the situation meeting the abnormality determination requirements, while the count will be cleared for the situation meeting the normality determination requirements. The state-of-charging exclusion unit 45 is used to record electrical parameters in the case of normality determination, and take the electrical parameters as comparison objects to determine the emergency starting power supply is in a charging state or in a short circuit state. After the results of the counting unit 43 meet the conditions, the short circuit determination unit 44 determines whether there is a short circuit. A state of short circuit will be determined under the condition that the charging state cannot be ruled out. When a state of short circuit is identified, the short circuit determination unit 44 drives the relay to turn off, so that the storage battery 11 stops supplying power to realize the short-circuit protection. The timeout switch-off unit 46 is used to run in any one of the emergency starting operation determination module 2, the load determination module 3 or the short circuit detection module 4, and to drive the relay to turn off after the accumulative running time exceeds 60 s.

Compared with the prior art, the method and system for short-circuit protection of emergency starting power supply of the present disclosure can quickly and accurately distinguish whether the emergency starting power supply of the vehicle is in an emergency starting state or a real short-circuit state. The detection and determination are based on the changes of electrical parameters in the emergency starting power supply in the time sequence, and are not affected by factors such as the starting situation, the type of batteries and the use environment of the vehicle. Meanwhile, comprehensive detection and determination may be performed based on the characteristics of starting electrical parameters and the characteristics of short-circuit electrical parameters. When a short circuit occurs, the short-circuit protection method of the present disclosure can identify the short circuit within 600 ms (30 times×20 ms). The short circuit is detected in less than 1 second, so that the emergency starting power supply is turned off before the short circuit damages the storage battery and other components, ensuring the safety of people and components. In particular, compared with the traditional methods of temperature determination and timeout determination, the present disclosure can protect the storage battery 11 better and prolong the service life of the storage battery 11.

The above embodiments mainly describe the basic principle, main features and advantages of the present disclosure. It should be understood by those skilled in the art that, the present disclosure is not limited by the embodiments described above. The embodiments described above and the descriptions in the description merely illustrate the principles of the present disclosure. Various changes and modifications may be made to the present disclosure without departing from the spirit and scope of the present disclosure. These changes and modifications all fall within the claimed scope of the present disclosure.

What is claimed is:

1. A method for short-circuit protection of emergency starting power supply, wherein the emergency starting power supply at least comprises a storage battery, a control device and a connection port, wherein when the emergency starting power supply is under emergency starting operating conditions with load, short-circuit detection of the emergency starting power supply is switched on; the short-circuit detection comprises the following steps:

continuously measuring voltage or current parameters of the emergency starting power supply at a preset frequency A;

determining whether the operation of the emergency starting power supply is abnormal according to change difference and change direction of the voltage or current parameters measured at two consecutive times, and counting the abnormality determination; when a change in the voltage parameters measured at two consecutive times falls within a preset range C, or the change in the voltage parameters measured at two consecutive times exceed the preset range C and the voltage parameters are reducing, it is determined that the emergency starting power supply in a respective period runs abnormally; when a change in the voltage parameters measured at two consecutive times exceeds the preset range C, and the voltage parameters are rising, it is determined that the emergency starting power supply in the respective period runs normally; or when a change in the current parameters measured at two consecutive times falls within the preset range C, or the change in the current parameters measured at two consecutive times exceed the preset range C and the current parameters are rising, it is determined that the emergency starting power supply in the respective period runs abnormally; when a change in the current parameters measured at two consecutive times exceeds the preset range C, and the current parameters are reducing, it is determined that the emergency starting power supply in the respective period runs normally; and when a count of continuous abnormality determination reaches a preset number of times B, it is determined that the emergency starting power supply is short-circuited, and the control device is driven to cut off the communication between the storage battery and the connection port; when the count of continuous abnormality determination does not exceed the preset number of times B, it is determined that the emergency starting power supply is in a normal state, and the count is cleared and recorded again;

recording the voltage parameters or current parameters as the normal electrical parameters when the count is cleared;

when the count of consecutive normality determination reaches the preset number of times B, identifying a difference between current voltage or current parameters and last recorded normal electrical parameters;

under the condition that the difference falls within a first preset value D, performing the short-circuit detection step again;

under the condition that the difference exceeds the first preset value D, it is determined that the emergency starting power supply is short-circuited and the circuit is disconnected.

2. The short-circuit protection method according to claim 1, wherein steps of determining the operating conditions for emergency starting of the emergency starting power supply comprise: continuously detecting whether the voltage or current parameters of the connection port meet the starting requirements, or detecting whether a starting switch of the emergency starting power supply is in an open state, so as to determine whether the emergency starting power supply is under the operating conditions for emergency starting; and steps of determining whether there is a load comprise: detecting and recording first voltage or current parameters that meets the operating conditions of the emergency starting power supply, and continuing to detect the voltage or current parameters until the difference between the real-time voltage or current parameters and the first voltage or current parameters exceeds a second preset value E, it is determined that there is a load and the short-circuit measurement is then performed, otherwise it is determined that there is not any load, and continuously detecting whether there is any load until a preset time period F is exceeded.

3. The short-circuit protection method according to claim 1, wherein the preset frequency A is that an interval between two consecutive measurements does not exceed 30 ms, and the preset number of times B falls within 25-35; the short-circuit detection further comprises the following steps: when the short-circuit detection exceeds the preset time period F, the control device is driven to cut off the communication between the storage battery and the connection port.

4. A system for short-circuit protection of emergency starting power supply, wherein the short-circuit protection system is disposed in a circuit between a storage battery and a connection port in the emergency starting power supply, and the short-circuit protection system comprises a short circuit detection module; and the short-circuit protection system comprises:

a data acquisition unit used for continuously measuring voltage parameters or current parameters of the emergency starting power supply at a preset frequency A;

a data comparison unit used for determining whether the operation of the emergency starting power supply is abnormal according to change difference and change direction of the voltage or current parameters measured at two consecutive times;

the data comparison unit is used for identifying whether a change in the voltage parameters measured at two consecutive times falls within a preset range C, and the data comparison unit used for identifying whether the change direction of the voltage parameters is rising or reducing; when a change in the voltage parameters measured at two consecutive times falls within a preset range C, or the change in the voltage parameters measured at two consecutive times exceeds the preset range C and the voltage parameters are reducing, it is determined an abnormality occurs, in which case, a counting unit counts the abnormality determination; or the data acquisition unit used for acquiring the current parameters, the data comparison unit is used for identifying whether a change in the current parameters measured at two consecutive times falls within a preset range C, and the data comparison unit used for identifying whether the change direction of the current parameters is rising or reducing; when a change in the current parameters measured at two consecutive times falls within a preset range C, or the change in the current parameters measured at two consecutive times exceed the preset range C and the current parameters are rising, it is determined an abnormality occurs, in which case, the counting unit counts the abnormality determination;

a counting unit used for counting the abnormality determination; and a short circuit determination unit, when a count of continuous abnormality determination reaches a preset number of times B, it is determined that the emergency starting power supply is short-circuited, and a control device is driven to cut off the communication between the storage battery and the connection port; when the count of continuous abnormality determination does not exceed the preset number of times B, it is determined that the emergency starting power supply is in a normal state, and count of the counting unit is driven to be cleared and recorded again;

a state-of-charging exclusion unit used for:

recording the voltage parameters or current parameters as the normal electrical parameters when the count is cleared;

when the count of consecutive normality determination reaches the preset number of times B, identifying the difference between the current voltage parameters or current parameters and the last recorded normal electrical parameters;

under the condition that the difference falls within a first preset value D, performing the short-circuit detection step again;

under the condition that the difference exceeds the first preset value D, it is determined that the emergency starting power supply is short-circuited and the circuit is disconnected.

5. The system for short-circuit protection of emergency starting power supply according to claim 4, wherein the system further comprises an emergency starting operation determination module used for continuously detecting whether the voltage or current parameters of the connection port meet the starting requirements, or detecting whether a starting switch of the emergency starting power supply is in an open state, so as to determine whether the emergency starting power supply is under the operating conditions of the emergency starting power supply; and the system further comprises a load determination module used for detecting and recording first voltage or current parameters that meets the operating conditions of the emergency starting power supply, and continuing to detect the voltage or current parameters until a difference between a real-time voltage or current parameters and the first voltage or current parameters exceeds a second preset value E, it is determined that there is a load and the short-circuit measurement is then performed, otherwise it is determined that there is not any load, and continuously detecting whether there is any load until a preset time period F is exceeded.

6. The system for short-circuit protection of emergency starting power supply according to claim 4, wherein the short circuit detection module further comprises a timeout switch-off unit, the timeout switch-off unit is used for driving the control device to cut off the communication between the storage battery and the connection port when short circuit detection exceeds the preset time period F.

\* \* \* \* \*